United States Patent
Hidaka et al.

[11] Patent Number: 5,898,177
[45] Date of Patent: Apr. 27, 1999

[54] ELECTRON MICROSCOPE

[75] Inventors: Kishio Hidaka, Hitachioota; Takeo Kamino, Hitachinaka; Toshie Yaguchi, Minori-machi; Katsuhisa Usami, Hitachi; Takashi Aoyama, Toukai-mura; Shigeyoshi Nakamura, Hitachinaka; Ryo Hiraga, Hitachioota; Masahiro Tomita, Hitachinaka, all of Japan

[73] Assignees: Hitachi, Ltd., Tokyo; Hitachi Instruments Engineering Co. Ltd., Hitachinaka, both of Japan

[21] Appl. No.: 08/900,001

[22] Filed: Jul. 24, 1997

[30] Foreign Application Priority Data

Aug. 8, 1996 [JP] Japan ................................. 8-209579

[51] Int. Cl.$^6$ ......................................... H01J 37/20
[52] U.S. Cl. ........................................ 250/311; 250/443.1
[58] Field of Search ................................. 250/311, 310, 250/443.1

[56] References Cited

U.S. PATENT DOCUMENTS

| | | | |
|---|---|---|---|
| 3,896,314 | 7/1975 | Nukui et al. | 250/443.1 |
| 4,789,781 | 12/1988 | Kitagawa et al. | 250/443.1 |
| 5,091,651 | 2/1992 | Hokke | 250/443.1 |
| 5,296,669 | 3/1994 | Kobayashi et al. | 219/201 |
| 5,367,171 | 11/1994 | Aoyama et al. | 250/443.1 |

Primary Examiner—Kiet T. Nguyen
Attorney, Agent, or Firm—Kenyon & Kenyon

[57] ABSTRACT

A method of operating an electron microscope under a high temperature and the electron microscope are provided. The electron microscope can stably set and efficiently heat a sample to observe and measure high temperature physical properties such as phase transformation, phase transition and the like required for development of a heat resistant material. In the method of operating the electron microscope and the electron microscope, a sample to be observed is set so as to position at a central hole of a double spiral flat filament, the detachable heating stage is fixed to the heating holder using screws of a pivot, and the heating stage is tilted by vertical movement of a crank-shaped arm. The heating stage and the arm are insulated from each other by an insulating body, and current from a power source is conducted by a conductor wire to heat the filament.

8 Claims, 7 Drawing Sheets

ELECTRON MICROSCOPE

BACKGROUND OF THE INVENTION

The present invention relates to a heating holder for an electron microscope.

In conventional electron microscopes, a sample to be observed is formed in a shape of a disk having a diameter of 3 mm near the center of which a hole is bored, and a portion near the hole having a thickness capable of transmitting an electron beam is observed. However, it is impossible to exactly control position of the hole. In regard to heating method, the sample is heated by a heater arranged circularly along the outer periphery of the disk. A problem of the heating method is that the heating portion and the observed portion are distant from each other and temperature of the sample cannot be guaranteed. In addition to this, prevention of leakage of heat becomes more difficult as heating temperature is increased. Although there is a method of preventing the heat leakage by covering all over the heating portion, the heating stage becomes so large in size that characteristic of the electron microscope is limited by occurrence of troubles in its double tilting function and element analysis. Further, measures against deposition of a sample to the heater due to melting of the sample caused by overheating, and the main body of the heating holder has to be exchanged in some cases.

Further, as a means to observe a high resolution image at a high temperature there is a method in which fine powder of a sample is sprinkled on a tungsten filament and heated by directly passing current through the tungsten filament. However, it cannot be guaranteed that the image shows a real characteristic of the sample in form of bulk since the sample is fine powder.

Sample holders for electron microscope known are disclosed in U.S. Pat. No. 5,296,669 and U.S. Pat. No. 5,367,171.

Japanese Patent Application Laid-Open No. 6-44936 discloses a heater for heating a sample which is wound in a coil shape and placed horizontal, and the sample is placed in the coil.

Further, Japanese Patent Application Laid-Open No. 6-68828 discloses a flat-shaped ceramic heater as a heater for heating a sample.

Any one of the heaters for heating a sample disclosed in these patent specifications cannot stably set the sample, and cannot efficiently heat the sample.

A problem to be solved by the present invention is to make it possible to observe a high resolution image of a sample in form of bulk at a high temperature up to 1800° C., which cannot be performed by the above-mentioned conventional technology, and to make it possible to always heat a sample under a clean environment by easily detaching its heating stage when the heating stage is damaged by deposition of the sample to the heating stage through the high-temperature observation.

SUMMARY OF THE INVENTION

An object of the present invention is to provide a method of operating an electron microscope having a heater for heating a sample disclosed in these patent specifications cannot stably set the sample, and cannot efficiently heat the sample, and the electron microscope, a heating stage and a sample holder of the electron microscope.

The present invention is characterized by a method of operating an electron microscope in which an electron beam is irradiated onto a sample to be observed to perform observation or measurement of the sample at a high temperature, wherein the observation or measurement is performed while an upper surface and an lower surface of the sample is being heated using a ring-shaped heater.

The present invention is characterized by a method of operating an electron microscope in which an electron beam is irradiated onto a sample to be observed to perform observation or measurement of the sample at a high temperature while the sample is being heated by a heater, wherein the observation or measurement is performed while the sample is being heated up to a temperature not lower than 500° C.

The present invention is characterized by a method of operating an electron microscope in which an electron beam is irradiated onto a sample to be observed to perform observation or measurement of the sample at a high temperature while the sample is being heated by a heater, wherein the sample is directly mounted on the heater to be heated.

The present invention is characterized by an electron microscope in which an electron beam is irradiated onto a sample to be observed to perform observation or measurement of the sample at a high temperature while the sample is being heated by a heater, wherein the heater is arranged so that the electron beam does not irradiate an upper surface and a lower surface of the sample.

The present invention is characterized by an electron microscope comprising an electron gun for generating an electron beam; an electron lens system for irradiating the electron beam onto a sample to be observed; a sample holder for holding the sample; and an optical system for observing a state of the sample; wherein the sample holder comprises a heating stage having a heater for heating the sample; and the heating stage has a double tilting function of to-and-fro and right-and-left and a construction to directly mounting the sample on the heater.

It is preferable that the heater comprises a double spiral filament which is formed by integrally winding a filament in two stages with a certain spacing between the stages so as to heat an upper surface and a lower surface of the sample at a time.

The present invention is characterized by a heating stage of an electron microscope comprising a heater for heating a sample to be observed up to a high temperature, and the sample is directly mounted on the heater.

The present invention is characterized by a sample holder of an electron microscope comprising a heating stage detachably having a heater for heating a sample to be observed up to a high temperature and directly mounting the sample on the heater, and the heating stage has a double tilting function of to-and-fro and right-and-left.

The present invention is characterized by a heater which comprises an insulating ceramic coating on an outer surface of a metallic wire having a high-melting point and is formed in a shape having spiral flat surfaces not less than two stages with a certain spacing between the stages.

In evaluation of structure change of a bulk material at a high temperature, size of a sample is made as small as possible in order to reduce a difference between heating temperature of a heater and temperature of the sample. Further, in order to guarantee heating temperature of the sample, the heating temperature can be exactly controlled by covering the upper side and the lower side of the sample with a heating body and by focused-ion-beam processing dimension of an observed portion of the sample.

In order to cope with deposition of a sample to a heater caused by melting of the sample due to overheating, a disposable and detachable heating stage of cassette type is employed. The heater is set in the heating stage and the sample is inserted into a gap of the double spiral heater from one end of the heating stage.

In order to make it possible to observe an atom image of a crystalline material at high temperature, a heating stage itself is used as a conductor body to a heater to prevent drift, and further the heater is coated with a ceramic thin film and vapor-deposited with carbon. In order to make a crystal orientation of the crystalline material in agreement with an incident direction of an electron beam, a double tilting function at high temperature is provided. The tilting by rotation of the heating holder is performed by rotation using an goniometer arranged in an outer periphery of the main body of the heating holder, and the tilting by rotation of the heating stage is performed by forming a concave surface on the heating stage and forming a top end of the arm in contact with the concave surface in a convex surface and by vertically moving the arm. A sample is formed in a rectangular shape smaller than 2 mm length, 0.5 mm width and 0.05 mm thickness, and an observed portion of the sample is made thin enough to image-form a high resolution image of transmission electron beam by focused-ion-beam processing. Then, the prepared sample is inserted into the gap of the double spiral heater which has countermeasure against noise reduction for an element analysis and against drift of a high temperature image, and the detachable heating stage is installed in the heating holder capable of double tilting. Heating power is supplied from a direct current or a rectifier power source, and the current is conducted to the double spiral heater through the heating stage which is insulated from the double tilting function of the heating holder. Crystal orientation of the sample is important to observe the high resolution image of the heated sample. Therefore, the high resolution image can be obtained by bi-axially adjusting the direction of the sample so as to obtain an optimized direction using the double tilting function of the heating holder.

It is preferable that a thermal expansion coefficient of a material forming the outer frame is in a range of $5.0 \times 10^{-7} \sim 1.2 \times 10^{-5}$/K. Further, it is preferable that the heating stage is made of a copper alloy, titanium or a stainless steel, and the outer frame is made of sialon, cordierite or titanium.

Further, a sample holder of an electron microscope in accordance with the present invention has an outer frame, a sample table installed in the outer frame and a tilting shaft for tilting the sample table, and it is preferable that a thermal conductivity of a material forming the heating stage is larger than a thermal conductivity of a material forming the outer frame, and that a thermal expansion coefficient of a material forming the tilting shaft is in a range of $5.0 \times 10^{-7} \sim 1.2 \times 10^{-5}$/K.

Furthermore, a sample holder of an electron microscope in accordance with the present invention has a sample holder and a bearing rod, it is preferable that a thermal conductivity of a material forming the bearing rod is smaller than a thermal conductivity of a material forming the sample holder. Particularly, it is preferable that the thermal conductivity of the bearing rod is within a range of 15~20 W/mK.

Further, a sample holder of an electron microscope in accordance with the present invention has a sample holder for holding a sample and a bearing shaft for finely control a position of the sample, and it is preferable that the sample holder is made of phosphor bronze and the bearing rod is made of a stainless steel type SUS 304.

DETAILED DESCRIPTION

Figure 1:
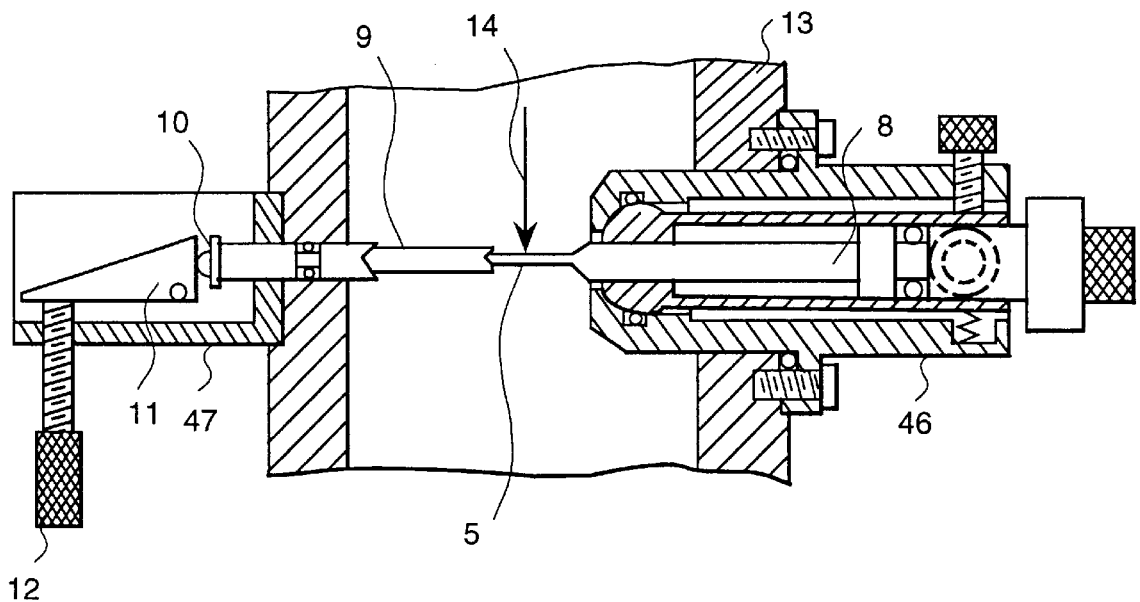
FIG. 1 is a cross-sectional view showing the overall construction of a sample drive portion of an electron microscope to which a sample holder is attached.

FIG. 1 is a cross-sectional view showing the overall construction of a sample drive portion of an electron microscope to which a sample holder 8 is attached. When the sample holder 8 is inserted into a column 13 of an electron microscope, the sample holder is in contact with a fine drive unit through a connecting rod (bearing rod) 9 to be stopped. The fine drive unit is composed of a fine drive shaft 10, a lever 11, a screw rod 12 and so on. As shown in FIG. 1, the system is constructed in such that an electron beam 14 passes through an outer frame 5 in a sample table portion of the sample holder 8 to measure a shape of a sample or the like.

Figure 2:
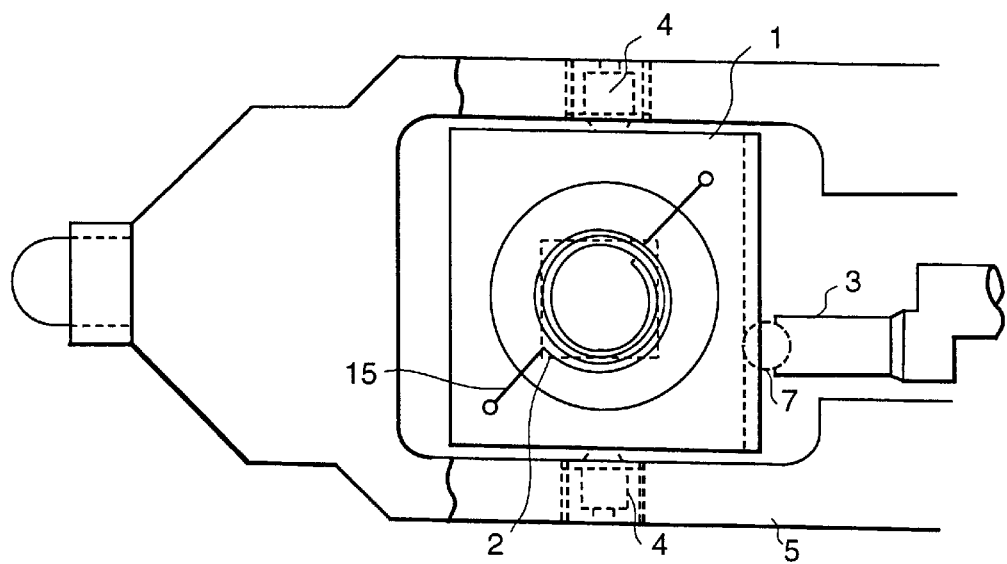
FIG. 2 is a plan view showing a portion of a heating stage in a sample holder.

FIG. 2 is a plan view showing the detail of the sample table (tilting table) of the sample holder 8.

Referring to FIG. 2, the sample holder 8 has a heating stage 1, a sample 2, an arm 3 for adjusting tilting of the heating stage 1, a pivot 4 for supporting the heating stage 1 from the frame 5 and a spherical insulator 7 at a contact portion between the arm 3 and the heating stage 1. A ceramic ball such as a ruby ball or a sapphire ball is used for the spherical insulator 7.

On the other hand, the outer frame portion 5 is made of cordierite of which the thermal conductivity is 1.7 W/mK, and accordingly the heat conduction from the heating stage 1 to the outer frame 5 is suppressed low. As a result, when the sample 2 is heated above 500° C., preferably above 1000° C., the temperature drift of the sample 2 is ±1° C., and the temperature of the outer frame 5 itself is heated up to about 110° C. and the temperature drift is suppressed below ±0.02° C. Therefore, displacement of position of the sample in the horizontal direction due to thermal expansion is almost negligible.

Since the heating stage 1 is made of a high thermal conductive material such as a copper alloy or titanium, temperature distribution in the heating stage is uniform. Since the portion of the outer frame 5 is made of a thermally insulating material (cordierite, alumina, sialon), temperature rise of the outer frame is suppressed lower compared to the portion of the heating stage 1. Therefore, the temperature drift of the outer frame (holder portion) is very small even if the temperature drift occurs in the portion of the heating stage 1. Accordingly, effects of the temperature on horizontal position of the sample portion and on tilting angle of the sample table are very small, and precise observation and measurement using the electron microscope can be performed. Table 1 shows thermal conductivities of the materials used in this embodiment of the present invention.

TABLE 1

|  | Heating stage | Outer frame |
| --- | --- | --- |
| Material | Phosphor bronze | Alumina |
| Thermal conductivity (W/mK) | 60 | 16.8 |
| Material | Phosphor bronze | Cordierite |
| Thermal conductivity (W/inK) | 62.9 | 1.7 |
| Material | Titanium (Ti) | Sialon |
| Thermal conductivity (W/mK) | 22 | 10.1 |

Referring to FIG. 1, when the sample holder 8 is inserted into the electron microscope, the sample holder 8 is brought in contact with the bearing rod 10 of the fine drive unit to be stopped. The fine drive unit is composed of the fine drive shaft 10, the lever 11, the screw rod 12, the bearing rod 9 and so on. In this embodiment, the sample holder 8 is made of phosphor bronze expect for a top end portion of the sample portion of the sample holder 8. Phosphor bronze has a large thermal conductivity (62.9 W/mK), and accordingly temperature distribution of the sample 2 becomes uniform.

On the other hand, the portion of the bearing rod 9 is made of a stainless steel type SUS 304 of which the thermal conductivity is small (15.1 W/mK).

As a result, it has been found that drift of the sample is less than ±0.1 n msec after 3 hours even if the sample is heated above 500° C. Table 2 shows the abovementioned result.

TABLE 2

|  | Bearing rod | Sample holder supporting portion |
| --- | --- | --- |
| Material | SUS 304 | Phosphor bronze |
| Thermal conductivity (W/mK) | 15.1 | 69 |
| Material | Sialon | Titanium |
| Thermal conductivity (W/mK) | 10.1 | 22 |

Figure 3:
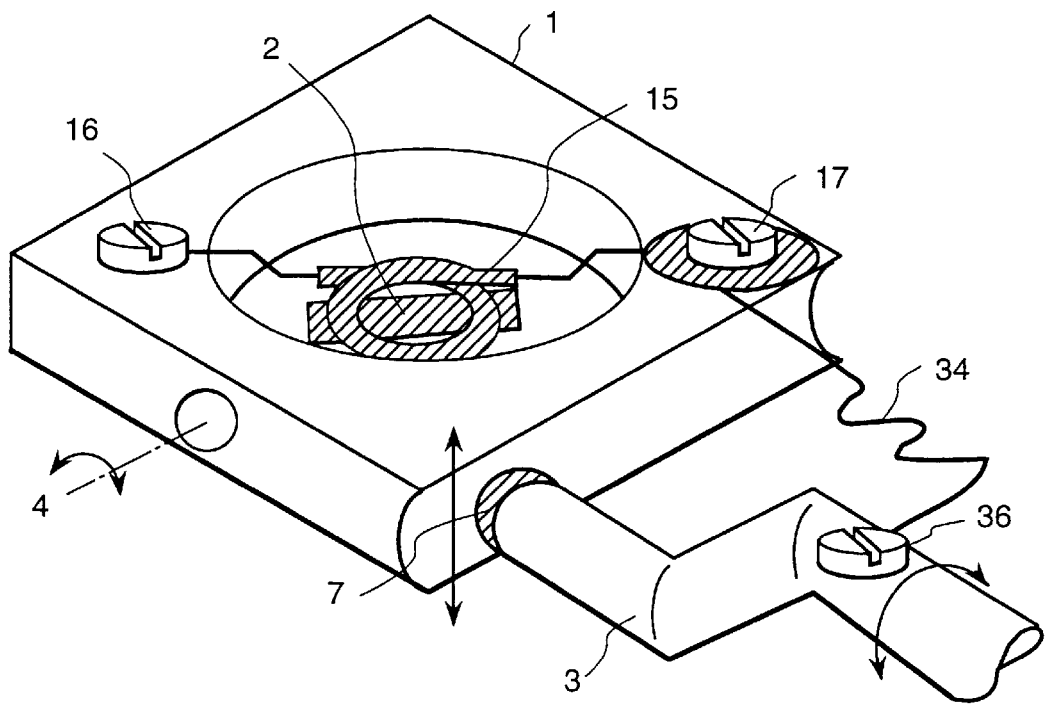
FIG. 3 is a perspective view showing a heating stage of a double tilting type.

FIG. 3 is a perspective view showing a heating stage 1 having a heater 15. The heating stage 1 having the heater has a double tilting function. The heater 15 has a double-spiral heater structure, and its lead wire is fixed to the heating stage 1 using a rotatable screw 16. When the lead wire is fixed, a sample 2 to be observed is inserted into a gap of the double spiral heater 15, and then the heater 15 is fastened loosely in taking thermal expansion into consideration using a rotatable screw 16 provided in a pivot 4 on the side of the heating holder 5. At fastening the pivot 4, a contact portion between an insulator body in the top end of the arm 3 and a concave surface 37 of the heating stage 1 is positioned. One end of a conductor wire 34 is fixed using a rotatable screw 36 attached in the arm 3. The other end is fixed using the rotatable screw 17 in the heating stage 1. The arm 3 is a crank-shaped arm as shown in the figure. The heating stage 1 is rotated to-and-fro with respect to the pivot 4 as a axis by rotation of the arm 3.

Figure 4A:
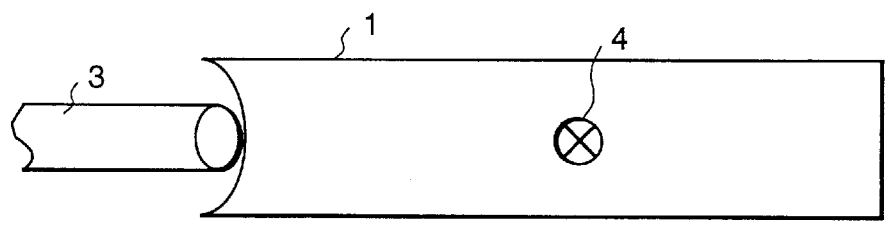
FIG. 4A and FIG. 4B are views showing the principle of heating stage tilting function.
Figure 4B:
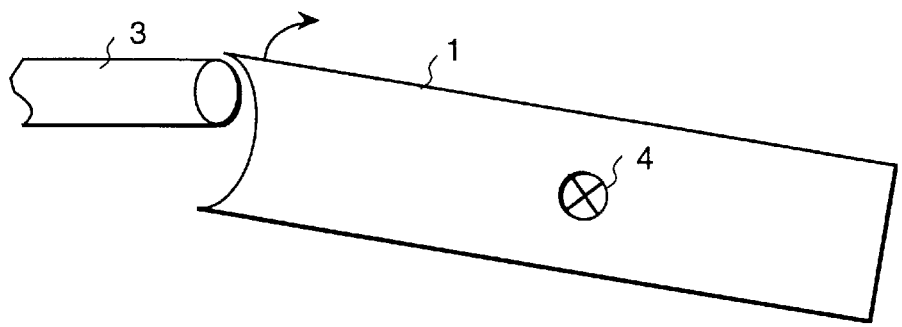

FIG. 4A and FIG. 4B are views showing the principle of a tilting function in regard to rotation of the heating stage 1.

The tilting function of the heating stage 1 is performed by that the shaft of the arm 3 is connected to a motor installed in the heating holder 8 and is applied with torque by rotation of the motor. The middle portion of the arm 3 is formed in a crank-shape so that the top end portion of the arm 3 swings along an arc by rotation of the motor through a spherical insulator body 7. The spherical insulator body 7 in the top end of the arm 3 is vertically moved along a concave surface of the heating stage by the shaft rotated by a power force of the main body of the sample holder. By forming a spherical insulator body 7 in the top end of the arm 3 using ruby or sapphire, abrasion resistivity of the concave surface of the heating stage 1 made of a copper alloy of phosphor bronze can be remarkably improved. Further, the sample can be rotated right-and-left directions by rotating the sample holder 8 in the axial direction.

Figure 5:
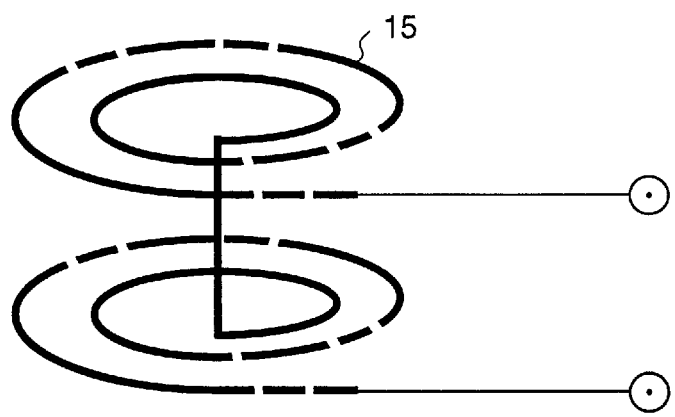
FIG. 5 is a view explaining a double spiral heater.

FIG. 5 is a perspective view showing the structure of the double spiral heater. The heater 15 is formed by leaving a middle portion of 0.51 mm width of a filament as it is, and folding the remaining portions of the filament over each other to form a shape as shown by FIG. 5. The folded filament is wound in spiral shape taking the central portion as an axial center as shown in FIG. 5, and the folded portions are wound in the same direction in two stages having a certain spacing between them to form a double-spiral shape as shown in FIG. 5. The tungsten wire of the formed heater 15 is coated with a ceramic to insulate between the coils and further carbon is vapor-deposited on the surface of the ceramic coated tungsten wire to complete the heater 15. As shown in this embodiment, since the sample 2 is inserted between the upper and lower spiral stages of the heater 15, the sample is maintained at a constant temperature as a whole. Although the sample is very small in size as to be described later, temperature of the sample cannot be uniformly maintained as a whole using only the lower heater. Further, in this embodiment, the sample is directly mounted on the lower spiral heater. It is allowable that either the sample may be or may not be in contact with the upper spiral heater. However, it is preferable the sample is close to the upper spiral heater.

In this embodiment, the heating stage 1 is detachable though it is fixed by pivot 4.

The heater 15 installed in said heating stage 1 is formed by leaving a middle portion of 0.5~1 mm width of a filament as it is, folding the remaining portions of the filament over each other, and winding the folded portions in the same direction to form a double-spiral shape having an upper and a lower stages. The heater 5 of double-spiral filament is coated with a thin film of a ceramic such as $Al_2O_3$, $Si_3N_4$, $ZrO_2$, $SiO_2$ and the like. Carbon is further vapor-deposited over the ceramic thin film coating.

The heating stage 1 is directly connected to a conductor wire passing inside the sample holder and current is directly conducted in the heater 15 through the heating stage 1 when the heating stage 1 is installed in the sample holder 8. Further, the heating stage 1 can be bi-axially tilted during heating a sample.

The double tilting can be performed by operating two tilting functions, a tilting function by rotation of the sample holder 8 and a tilting function by rotation of the heating stage 1 independently of each other, at a time.

The tilting function of the heating stage 1 can be performed by forming one side surface of the heating stage 1 in a concave surface, setting an arm in the sample holder so as to be in contact with the concave surface, and vertically moving the arm along the concave surface of the heating stage.

In the rotation of the heating stage 1, screw-type pivots 4 are provided in the middle of both sides of the heating stage 1 to moderate restriction of rotation of the heating stage 1 due to thermal stress at heating by adjusting a degree of fastening the screws.

The arm used for double tilting has a ruby ball or a sapphire ball installed in a top end 7 of the arm 3, and the arm 3 and the concave surface of the heating stage 1 are in close contact with and insulated from each other.

A sample 2 to be inserted in the heating stage 1 is formed in a rectangular shape smaller than 2 mm length, 0.5 mm width and 0.05 mm thickness, and an observed portion of the sample 2 is performed with focused-ion-beam processing prior to observation.

The sample 2 is inserted into a gap of 0.5~1 mm width formed in the double-spiral filament when the sample is set in the heating stage 1.

At least a part of one side of the sample 2 is formed in a shape having an area of 5 μm width and 5 μm length at maximum and less than 50 nm thickness in prior to inserting the sample into the heating stage 1. Then, that portion is observed.

By adjusting a portion to be observed of the sample 2 so as to come at a position of a hole in the central portion of the double-spiral filament 15, an accelerated electron beam is transmitted through or reflected by only the observed portion of the sample without being interrupted by the double spiral filament.

A heating test can be always performed under a clean environment by removing a contaminated heating stage 1 and additionally setting a new heating stage when the sample 2 is set in the heating stage 1 and the heating stage 1 is contaminated by melting of the sample caused by overheating.

Supplying of current to a heater of the heating stage is performed by two methods of a rectifier type power source and a battery type direct current power source.

It is possible to perform a long period constant heating and a complex thermal history to the sample using the rectifier type power source.

It is possible to perform observation of a high resolution image at a high temperature using the battery type direct current power source.

It is possible to prevent background noise produced from the ceramic thin film coating at element analysis in an observed portion of the sample from increasing by vapor depositing carbon onto the surface of the heater.

It is possible to reduce drift due to thermal expansion during observation of a high resolution image at a high temperature to the sample by vapor depositing carbon onto the surface of the heater.

It is possible to reduce drift due to thermal expansion during observation of a high resolution image at a high temperature to the sample by directly conducting current through the heating stage 1.

It is possible to prevent thermal leakage from the heating stage 1 to a shaft portion of the sample holder 8 by electrically and thermally insulating between the heating stage 1 and the sample holder.

The tilting function of the heating stage 1 by vertical movement of the arm is performed without any pressing member such as a spring provided in the opposite side of the heating stage through a pivot.

Figure 7:
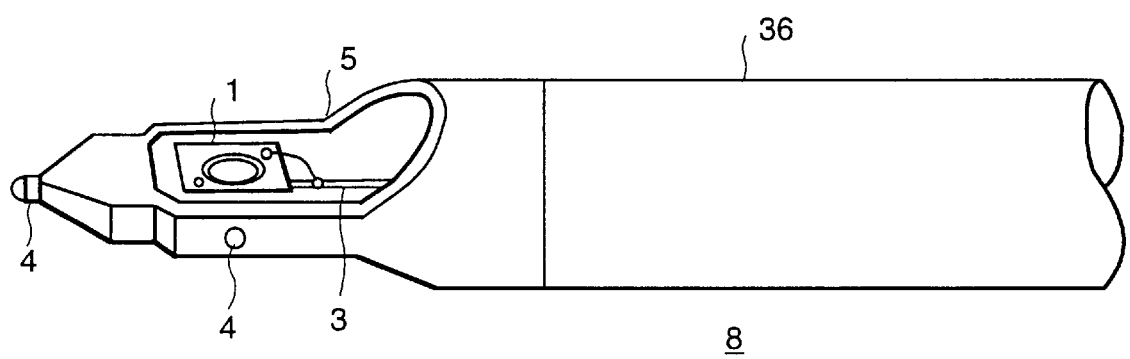
FIG. 7 is a perspective view of a sample holder.
Figure 6:
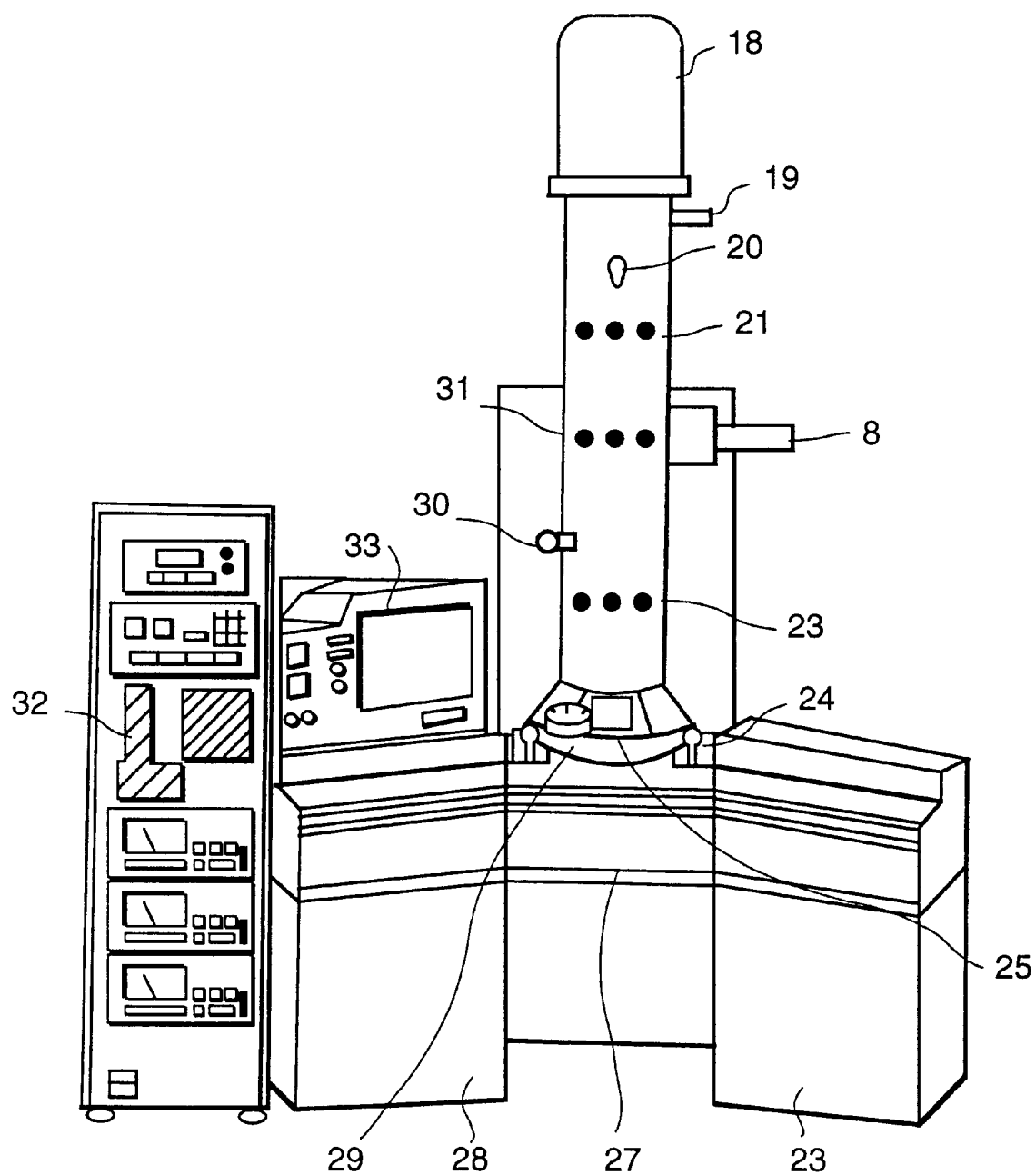
FIG. 6 is a view showing the overall construction of a transmission electron microscope using a sample holder.

FIG. 6 is a view showing the overall construction of a transmission electron microscope using a sample holder 8 having double tilting capability, and FIG. 7 is a perspective view of the sample holder 8. As shown in FIG. 6, an electron gun 18 generating an electron beam, a gun valve 19, a condenser lens portion 21 and an aperture 20 for the condenser lens are arranged in an upper side of a sample holder 8, and in a lower side of the sample holder portion 8 there are arranged an objective lens portion 31, an aperture 30 for field of view, an intermediate and projection lenses 23, a viewing chamber 29, a camera chamber 27 and so on. A state of a sample can be observed using a loupe 25 and a monitoring unit 33, and a sample observation position can be adjusted by operating a sample translation knob 24, and a sample position can be adjusted and a picture of the sample can be taken using operation panels 26, 28 and a controller 32 arranged in right hand side and left hand side. The sample holder 8 has a top end portion 5 for mounting a heating stage 1 and a supporting portion 36 for supporting the top end portion which are made of the above-mentioned material.

Figure 8:
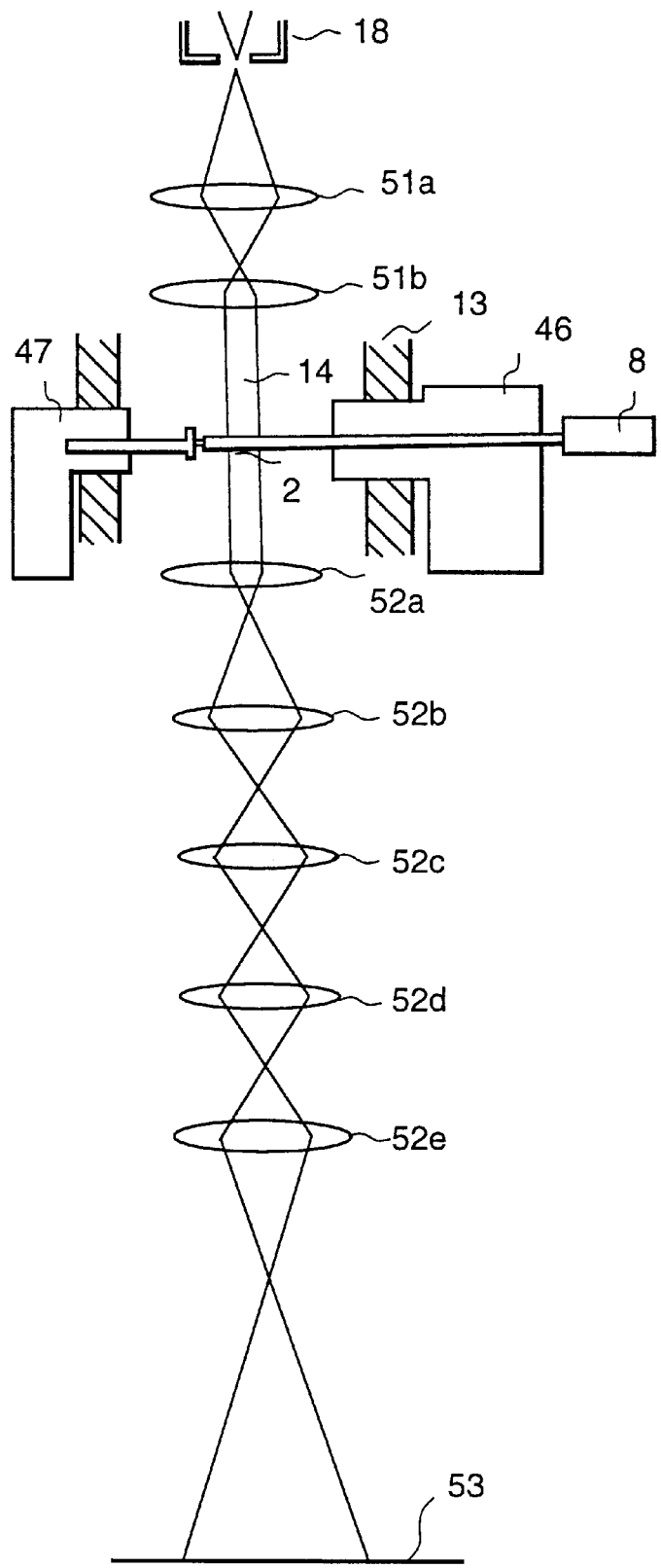
FIG. 8 is a view showing an electron beam path in a transmission electron microscope.

FIG. 8 is a view showing an irradiation system path of an electron beam in the transmission electron microscope of FIG. 6. Referring to the figure, an electron beam 14 coming out from the electron gun 18 is converged by condenser lenses 51a, 51b to irradiate a sample 2. The electron beam having passed through the sample 2 is enlarged by objective, intermediate and projection lenses 52a~52e to image-form on a fluorescent plate 53. The sample holder 8 is placed between the two-stage irradiation lens system 51a, 51b and the five-stage image-forming lens system 52a~52e, and held by drive units 46, 47 attached to a column 43.

A sample was actually observed using a transmission electron microscope in accordance with the present invention. A silicon nitride sintered piece is used as the sample.

Figure 9:
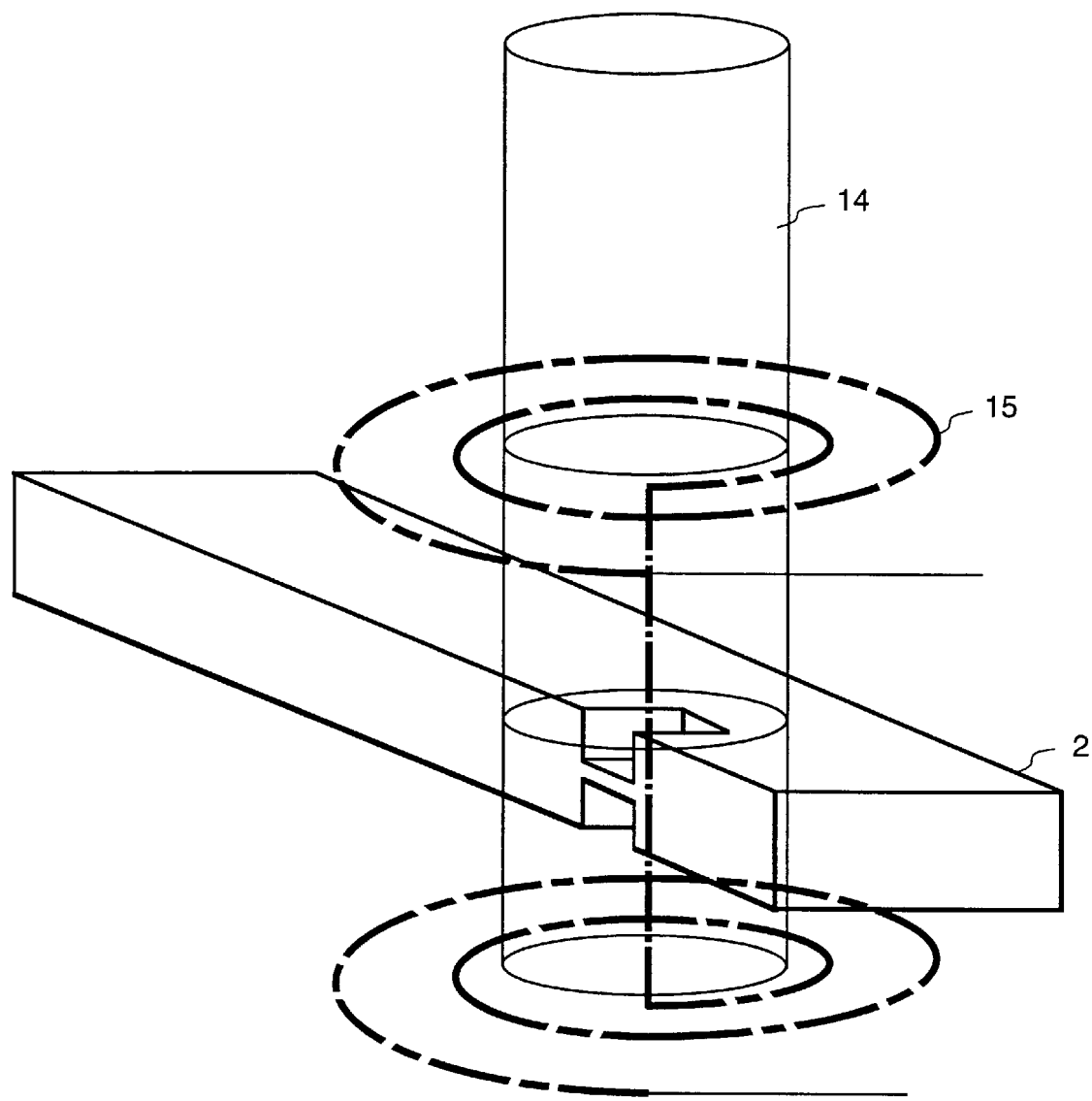
FIG. 9 is a view explaining the structure of a heater in a state of observing a sample.

In this embodiment, phase transformation from α-$Si_3N_4$ to β-$Si_3N_4$ was observed as α-$Si_3N_4$ at room temperature and β-$Si_3N_4$ at 1800° C. A sample was formed in a rectangular shape smaller than 2 mm length, 0.5 mm width and 0.05 mm thickness, and an observed portion of the sample was made thin enough to image-form a high resolution image of transmission electron beam by focused-ion-beam processing Then, the portion to be observed was inserted into the gap of the double spiral heater as shown in FIG. 9. It was revealed from the results of the observation of a high resolution image of α-$Si_3N_4$ at room temperature and the observation of a high resolution image of β-$Si_3N_4$ at 1800° C. that the resolution was 0.18 nm. The image of β-$Si_3N_4$ agrees with an image produced by computer simulation. Temperature of the phase transformation from α-$Si_3N_4$ to β-$Si_3N_4$ was above 1600° C., which shows observation of high resolution image up to 1800° C. is possible.

Further, in this embodiment, a sample 2 to be observed is set on a heater 15 of a heating stage 1, the heating stage 1 is placed between a rectangular gap in a top end portion of a sample holder 8, and a pivot 37 of the heating stage and a pivot of the sample holder 40 are positioned so as to meet to each other and fastened each other using a screw 4. A concave surface of the heating stage is brought in contact with the top end of an arm 3 to hold the heating stage horizontal. A lead wire set in the heating stage 1 is connected to the heater 15.

After mounting the heating stage 1 onto the sample holder 8 in the above manner, the sample holder 8 is inserted into an electron microscope. The sample holder 8 is connected to two kinds of power sources which are switch-selectable between them. A direct current power source is a power source which is small in thermal oscillation and accordingly capable of taking a high resolution image, and heating temperature can be varied by regulating the current. A rectifier power source can be installed with a program of desired thermal history, and accordingly it is possible to observe a sample during heating by setting a long period heating and/or a complex heat cycle. The observation is performed through brightness contrast of fluorescence on a fluorescent plate by a transmission electron beam. The principle is that an electron beam emitted from an electron gun 18 is accelerated to transmitted through a sample to be observed mounted on a heating holder 1, and the transmission electron beam is enlarged by an electromagnetic lens to form brightness contrast of fluorescence produced by collision of the transmission electron beam on a fluorescent plate.

An observation was performed under a condition of electron acceleration voltage of 200 kV, and magnification of 100,000 times to 1,000,000 times. An observed position in one horizontal direction (X-axis) is positioned by moving the fine drive shaft 10 through rotating the screw rod 12 shown in FIG. 1.

Referring to FIG. 1, when the sample holder 8 is inserted into the electron microscope, the sample holder 8 is brought in contact with the bearing rod 10 of the fine drive unit to be stopped. The fine drive unit is composed of the fine drive shaft 10, the lever 11, the screw rod 12, the bearing rod 9 and so on.

In the present invention, it is possible to install a heating power source to the heater 15 for heating the sample 2 in the sample holder 8. A battery can be used for the power source and can be built into the power source.

Figure 10:
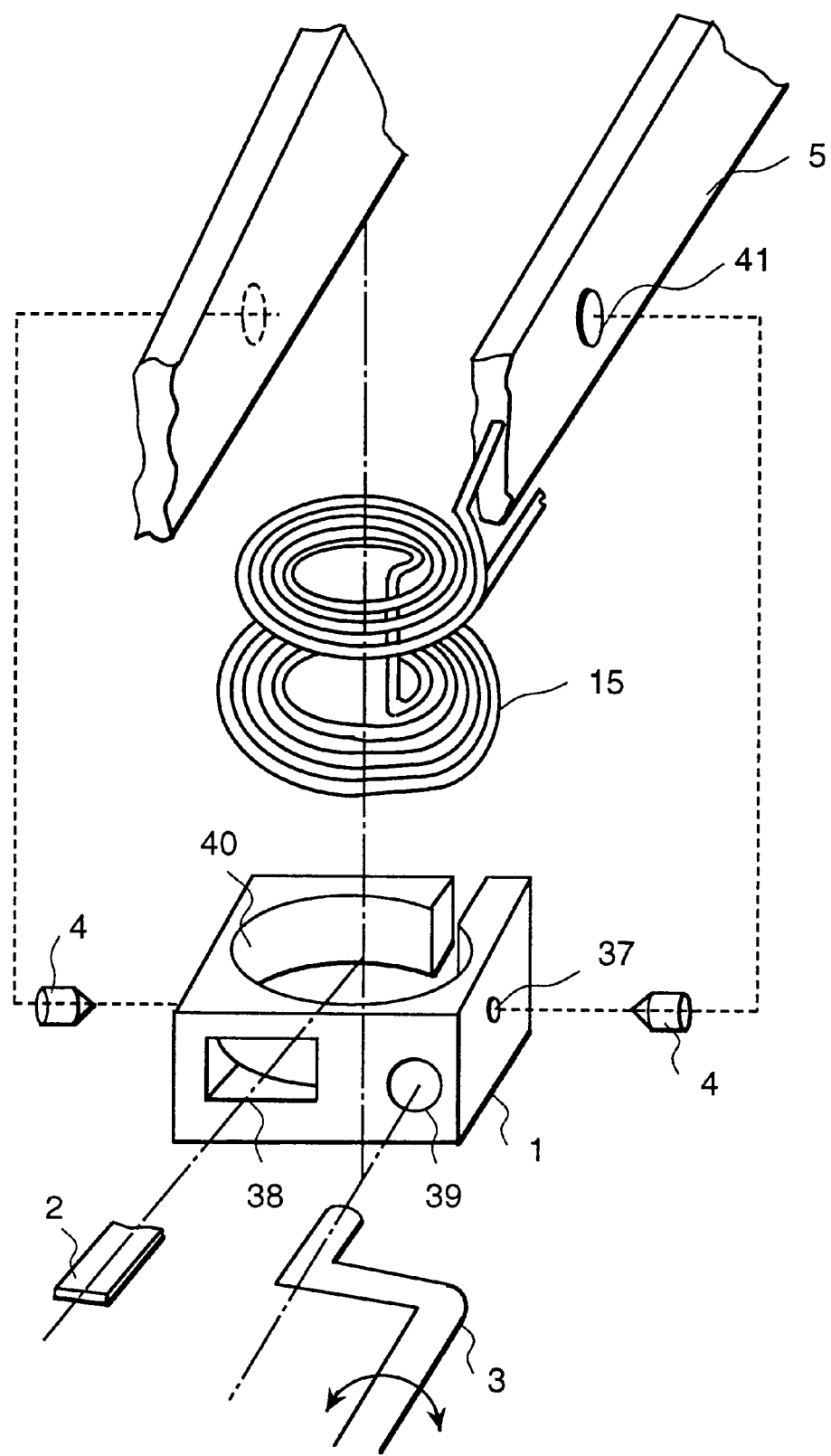
FIG. 10 is an assembling view showing another embodiment of a heating stage.

FIG. 10 is an assembling view showing another embodiment of a heating stage. A heating stage 1 is fixed to an outer frame 5 by fastening pivots 4 to depressed portions 37 formed in the heating stage 1 through pivot holes 41 in the outer frame 5. A heater 15 is formed in a two-stage spiral shape as the same as in FIG. 9, and placed inside a concave 40 formed in the heating stage 1. A sample 2 is inserted between the two stages of the spiral heater 15 in the heating stage 1 through a sample inserting port 38 for inserting the sample, and mounted on the lower portion of the heater 15. The heating stage 1 can be rotated to-and-fro around the pivots 4 as an axis by rotation of an arm 3. An end of the arm 3 is inserted in a depressed portion 39 provided in the heating stage 1 and the arm 3 can be rotated.

According to the present invention, physical characteristics of a heat resistant material such as phase transition and transformation can be evaluated in atomic level, and it is possible to directly observe and measure physical properties under a high temperature condition.

What is claimed is:

1. An electron microscope in which an electron beam is irradiated onto a sample to be observed to perform observation or measurement of said sample at a high temperature while said sample is being heated by a heater, wherein said heater is wound in a spiral on a plane so as to mount said sample on said spiral heater and arranged so as to prevent said electron beam from being irradiated onto said heater.

2. An electron microscope according to claim 1, wherein said heater comprises a double spiral filament having upper and lower spiral portions formed in different planes from each other with a certain spacing between said upper and lower spiral portions so as to mount said sample on said lower spiral portion in said spacing to heat said sample on upper and lower sides thereof at the same time.

3. An electron microscope comprising:

an electron gun generating an electron beam;

an electron lens system irradiating said electron beam onto a sample to be observed;

a sample holder; and an optical system for observing a state of said sample;

wherein said sample holder comprises a heating stage having a heater, said heater being wound in a spiral on a plane such that said sample may be mounted on said spiral heater; and said heating stage has a double tilting function of to-and-fro and right-and-left and a construction to directly mount said sample on said heater.

4. An electron microscope according to claim 3, wherein said heater comprises a double spiral filament which has upper and lower spiral positions formed in different planes from each other with a certain spacing between said upper and lower spiral portions so as to mount said sample on said lower spiral portion in said spacing to heat said sample on upper and lower sides thereof at the same time.

5. An electron microscope in which an electron beam is irradiated onto a sample to be observed to perform observation or measurement of said sample at a high temperature comprising a heater wound in a spiral on a plane, the sample mounted on said spiral heater such as to prevent said electron beam from being irradiated onto said heater.

6. An electron microscope according to claim 5, wherein said heater comprises a double spiral filament having upper and lower spiral portions formed in different planes with a spacing therebetween, said sample mounted on said lower spiral portion so that said sample is heated from upper and lower sides thereof at the same time.

7. An electron microscope comprising:

an electron gun generating an electron beam;

an electron lens system irradiating said electron beam onto a sample to be observed;

a sample holder including a heating stage having a heater, said heater being wound in a spiral on a plane and arranged such that said sample may be directly mounted on said spiral heater, said sample holder being supported for tilting motion in two axes thereby permitting to-and-fro and right-and-left motion; and an optical system observing said sample.

8. An electron microscope according to claim 7, wherein said heater comprises a double spiral filament having upper and lower spiral portions formed in different planes with a spacing therebetween, said sample mounted on said lower spiral portion so that said sample is heated from upper and lower sides thereof at the same time.

* * * * *

UNITED STATES PATENT AND TRADEMARK OFFICE
CERTIFICATE OF CORRECTION

PATENT NO. : 5,898,177
DATED : 27 April 1999
INVENTOR(S) : Kishio HIDAKA et al.

It is certified that error appears in the above-identified patent and that said Letters Patent is hereby corrected as shown below:

| Column | Line | |
|---|---|---|
| 1 | 19 | Delete "all over"; before "heating" insert --entire--. |
| 1 | 23 | After "sample" change "to" to --onto--. |
| 2 | 4 | Before "lower" change "an" to --a--. |
| 2 | 5 | Change "is" to --are--. |
| 2 | 36 | Change "to directly mounting" to --allowing direct mounting of--. |
| 3 | 1 | After "sample" change "to" to --onto--. |
| 3 | 15 | Change "an goniometer" to --a goniometer--. |
| 3 | 64 | Change "control" to --controlling--. |
| 4 | 33 | After "such" insert --a way--. |
| 5 | 25 | Change "expect" to --except--. |

UNITED STATES PATENT AND TRADEMARK OFFICE
CERTIFICATE OF CORRECTION

PATENT NO. : 5,898,177
DATED : 27 April 1999
INVENTOR(S) : Kishio HIDAKA et al.

It is certified that error appears in the above-identified patent and that said Letters Patent is hereby corrected as shown below:

| Column | Line | |
|---|---|---|
| 5 | 43 | Change "69" to --60--. |
| 5 | 49 | Change "heater" to --heater 15--. |
| 5 | 56 | Before "fastening" insert --the--; after "fastening" insert --of--. |
| 5 | 64 | Before "axis" change "a" to --an--. |
| 6 | 18 | Change "0.51" to --0.5 ~1--. |
| 6 | 48 | Change "stages" to --stage--. |
| 8 | 56 | Before "each" delete "to"; after "fastened" insert --to--. |
| 9 | 9 | Before "transmitted" insert --be--. |

Signed and Sealed this

Twenty-ninth Day of August, 2000

Attest:

Q. TODD DICKINSON

Attesting Officer

Director of Patents and Trademarks